United States Patent
Saikawa et al.

(10) Patent No.: US 10,018,790 B1
(45) Date of Patent: Jul. 10, 2018

(54) COMBINED-WAVE (MULTIPLEXING) LASER BEAM SOURCE

(71) Applicant: Shimadzu Corporation, Nakagyo-Ku, Kyoto-Shi, Kyoto (JP)

(72) Inventors: Jiro Saikawa, Kyoto (JP); Junki Sakamoto, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 15/702,972

(22) Filed: Sep. 13, 2017

(51) Int. Cl.
 *G02B 6/27* (2006.01)
 *G02B 6/42* (2006.01)
 *H01S 5/40* (2006.01)

(52) U.S. Cl.
 CPC ......... *G02B 6/4206* (2013.01); *G02B 6/2706* (2013.01); *G02B 6/2753* (2013.01); *G02B 6/2773* (2013.01); *G02B 6/4213* (2013.01); *H01S 5/4025* (2013.01)

(58) Field of Classification Search
 None
 See application file for complete search history.

(56) References Cited

U.S. PATENT DOCUMENTS

| | | | | |
|---|---|---|---|---|
| 5,291,571 A * | 3/1994 | Kunikane | ................ | G02B 6/34 359/489.09 |
| 5,533,152 A * | 7/1996 | Kessler | .............. | B23K 26/0604 359/489.07 |
| 6,104,741 A * | 8/2000 | Igarashi | ................ | G02B 6/425 359/489.07 |
| 6,137,820 A * | 10/2000 | Maag | ................. | H01S 3/09415 372/106 |
| 7,330,493 B2 * | 2/2008 | Luo | ......... | H01S 3/005 372/50.1 |
| 8,837,870 B1 * | 9/2014 | Wang | ................... | G02B 27/283 359/489.01 |
| 2004/0067016 A1 * | 4/2004 | Anikitchev | .......... | G02B 6/4206 385/34 |
| 2012/0189306 A1 * | 7/2012 | Du | ....................... | G02B 6/4215 398/65 |
| 2013/0250416 A1 * | 9/2013 | Xiong | ..................... | G02B 5/30 359/494.01 |
| 2015/0015952 A1 * | 1/2015 | Wolak | .................. | G02B 27/283 359/489.08 |
| 2015/0241632 A1 * | 8/2015 | Chann | .................. | G02B 6/2706 385/27 |
| 2016/0277140 A1 * | 9/2016 | Wu | ......................... | H04J 14/06 |

FOREIGN PATENT DOCUMENTS

JP 2002-202442 7/2002
JP 2016-184135 A * 10/2016

* cited by examiner

*Primary Examiner* — Mike Stahl
(74) *Attorney, Agent, or Firm* — Andrew F. Young, Esq.; Lackenbach Siegel, LLP

(57) ABSTRACT

A combined-wave (multiplexing) laser source of the present invention has an optical fiber; a plurality of laser sources $1a$-$1c$ that are in-place in a preset interval with regard to each other and which respectively emit laser light, a birefringent element 3 that separates spatially an incident laser light to an ordinary ray and an extraordinary ray and outputs separated rays every respective laser lights, and a convergence lens 4 that collects the ordinary ray and the extraordinary ray separated by said birefringent element relative to the respective laser lights and converges the rays to the optical fiber.

4 Claims, 4 Drawing Sheets

COMBINED-WAVE (MULTIPLEXING) LASER BEAM SOURCE

CROSS REFERENCE TO RELATED APPLICATIONS

This application relates to, but does not claim priority from, JP 2015-065497 filed Mar. 31, 2015, which in turn published as Pub. No. JP 2016-184135 published on Oct. 20, 2016, the entire contents of which are incorporated herein by reference.

BACKGROUND OF THE INVENTION

Field of the Invention

The present invention relates to a combined-wave (multiplexing) laser source that provides high-intensified laser by combining laser beams lights from a plurality of laser sources which is independent from one another. Further, the present invention relates to an exposure device, a processing machine, an illumination device and a medical equipment (device), of which a light source is the combined-wave laser source set forth above.

Description of the Related Art

Conventionally, a method for intensifying laser power output is disclosed in Japanese patent published JP2002/202442, in which multiple laser lights from a plurality of laser sources are combined into one optical fiber and so forth. In addition, a method that combines fibers, in which a plurality of light sources is collected, to be one fiber by bundling is known.

A series of means; including (1) using a light source or a laser bar, in which semiconductor laser chips called semiconductor laser array are arranged in approximately a few hundreds μm interval and in the high-density thereof, or semiconductor laser bars, as the light source; (2) rearranging lights emitted from a plurality of laser sources right before the fiber-bundling convergence lens using an anamorphic optical system or a steering optical system, and (3) making composite wave to one optical fiber having a product value which is the product value of the core diameter having the same product value of emission size of the semiconductor laser and the beam divergence angle thereof or a few times larger core diameter and the NA (numerical aperture) value; achieves obtaining particularly emitted light having less uneven intensity from the fiber.

FIG. 4 is a diagram illustrating a structure of the conventional combined-wave laser source. Referring to FIG. 4, the semiconductor lasers $1a$-$1c$ emit the laser light following an induction of the electric current. Lenses $2a$-$2c$ guides the laser light from the semiconductor lasers $1a$-$1c$ to a convergence (collection) lens 11. The convergence lens 11 converges multiple laser lights from the semiconductor lasers $1a$-$1c$ and combines the waves to the optical fiber 5. A collimate lens 6 emits the laser light, which is the combined-wave laser light, from the optical fiber 5 as a parallel light.

RELATED PRIOR ART DOCUMENTS

Patent Document 1: JP Patent Published 2002-202442

ASPECTS AND SUMMARY OF THE INVENTION

Objects to be Solved

On the other hand, the short-wave semiconductor laser is mounted inside of the semiconductor lasers package (TO-Can package) filled up with dry-nitrogen gas or dry-air, which has generally the diameter of Φ5.6 mm or Φ9 mm and a window, to prevent surface deterioration thereof due to adhesion of foreign materials. Therefore, such semiconductor lasers are hardly arranged in the high-density due to the restriction of the package size. Consequently, the incident beam to the convergence lens 11 is subject to form a crude-dense distribution and an uneven intensity of the contrasting density takes place in the light intensity distribution 12 of fiber-output, so that homogeneous emission cannot be achieved. When quality of the laser light is deteriorated in such way, any function for the laser application, including an exposure, a machine processing, an illumination and so forth, which is the purpose of the combined-wave laser is impaired.

Specifically, negative effects; including that a homogeneous exposure and the homogeneous illumination are unachieved in the cases of the exposure and the illumination and that the convergent beam is practically not making a one-point in the case of the machine processing, so that a fine machine processing is unfeasible; take place.

Accordingly, the purpose of the present invention is to provide a combined-wave (multiplexing) laser source that suppresses an uneven intensity distribution of the fiber output light in the case of a light emission source having a light beam of which the laser light interval relative to the emission size of each laser is discrete. Here, "discrete" means that the interval set forth above is the same as or longer than the emission point of the bar-shaped array laser element having an emission element in the ordinary array form even depending on an application of the laser light. The laser set forth here is not limited to a semiconductor laser and multiple laser beams ineligible to be adjacent are included.

Means for Solving the Problem

To solve the above problems, a combined-wave laser source according to the present invention comprises: an optical fiber; a plurality of laser sources; a birefringent element that separates an incident laser light to an ordinary ray and an extraordinary ray and outputs such separated rays every respective laser lights, in which multiple laser lights from the plurality of laser sources are incident; and a convergence lens that collects the ordinary ray and the extraordinary ray separated by the birefringent (birefractive) element relative to the respective laser lights and converges to the optical fiber.

Effect of the Invention

According to the aspect of the present invention, a combined-wave laser source that can suppress unevenness of the intensity distribution of the fiber output light can be provided based on the following aspects: the laser light incident to the birefringent element spatially separates to the ordinary ray and the extraordinary ray depending on the polarization direction of the laser light and is output; and the convergence lens converge the ordinary ray and the extraordinary ray separated by the birefringent element relative to the respective laser lights to the optical fiber, so that the space between light beams, which cannot be filled with the ordinary ray alone, can be filled with the extraordinary ray; and consequently, degree of the light beam distribution occupation within the lens diameter of the convergence lens increases.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
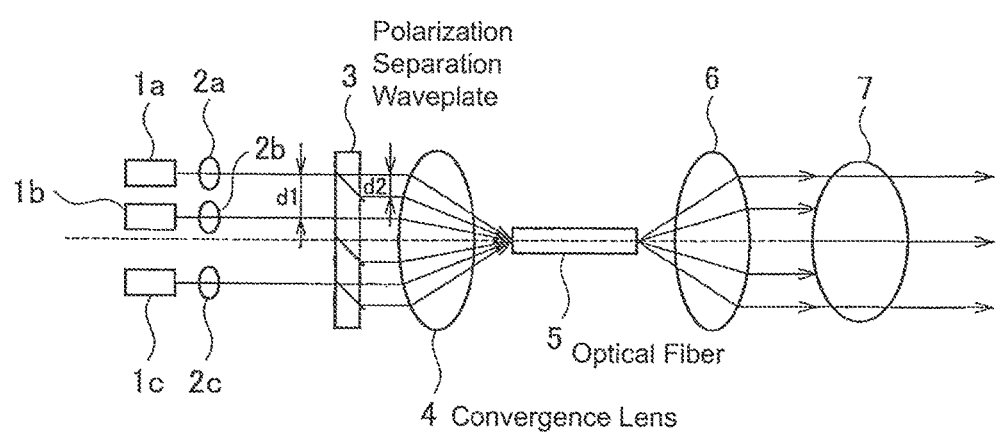
FIG. 1 is a diagram illustrating a structure of the combined-wave laser source according to the aspect of the Embodiment 1 of the present invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

The inventors sets forth Embodiments of the present invention based on the following FIGs.

Embodiment 1

Figure 3:
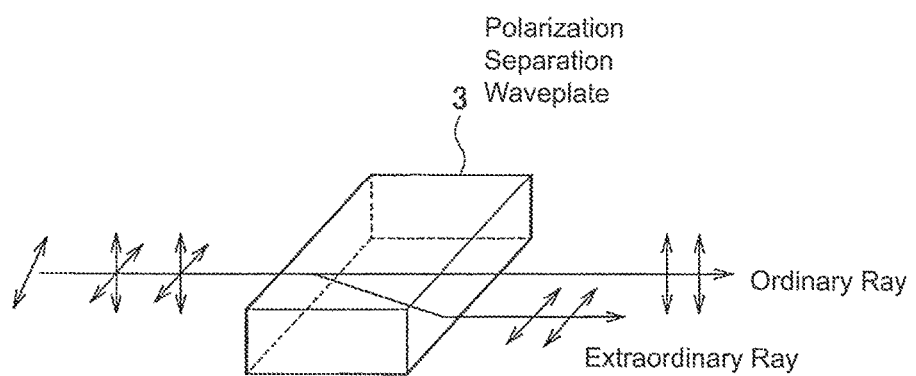
FIG. 3 is a diagram illustrating a polarization separation waveplate according to the aspect of the Embodiment 1 of the present invention.
Figure 4:
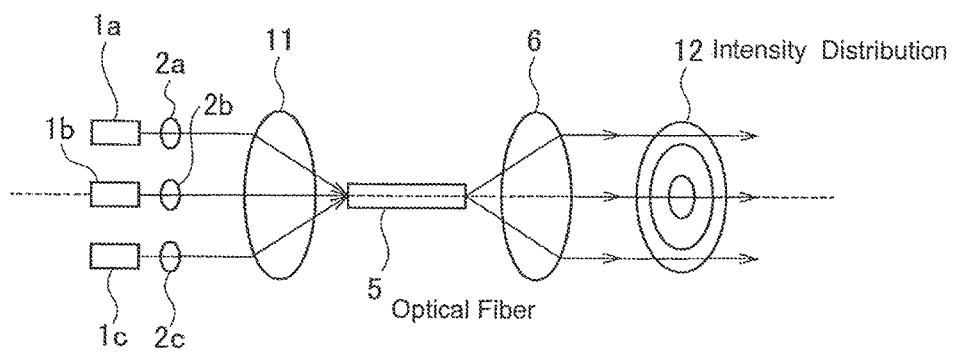
FIG. 4 is a diagram illustrating a structure of the conventional combined-wave laser source.

FIG. 1 is a diagram illustrating a structure of the combined-wave laser source according to the aspect of the Embodiment 1. FIG. 3 is illustrating an Embodiment using the polarization separation waveplate in which birefringent material as a birefringent element forms a parallel flat plate. Referring to FIG. 1, the combined-wave laser source according to the aspect of the Embodiment 1 comprises a number of semiconductor lasers 1a-1c, lenses 2a-2c, a polarization separation waveplate 3, a convergence lens 4, an optical fiber 5, and a collimate lens 6. Here, the additional reference signs a-c do not mean three elements, but means at least two elements.

The semiconductor lasers 1a-1c are arranged every preset interval d1 and excited by injecting a carrier having an electron and a hole, which are injected by driving electric current, and then the laser light emits due to conductive emission occurred when the pair of carriers of the injected electrons and holes decays. The semiconductor lasers may include an array laser having multiple laser light emission mechanism in the bar-shaped semiconductor and a laser that emit-distributes the light planarly, e.g., surface-emitting laser and a stack laser in which bar-shape array lasers are layered.

In the case of a short-wave laser having the wavelength shorter than 530 nm, the photon energy of the laser increases, so that adhesion of particles on the emitting end-surface and contamination with foreign materials including even surface substances on the semiconductor laser may take place due to such as a chemical reaction. Therefore, the lasers are in many cases sealed in the air-tight package filled with an inert gas such as dry-nitrogen gas or dry-air.

When the semiconductor laser is a single chip, an individually sealed element in a TO-Can package with a clear window made of an optical glass or a sapphire can be used as multiple semiconductor lasers 1a-1c.

Lenses 2a-2c are arranged every preset interval d1 facing the semiconductor lasers 1a-1c and guides the laser light from the semiconductor lasers 1a-1c to a polarization separation waveplate 3.

When the spread angle of the beam as the semiconductor laser is large, the collimate arrangement that provides somewhat parallel lights is better. When the spread angle is small, lens 2a-2c are not mandatory.

Light is a kind of electromagnetic wave which vibrates and propagates with a perpendicular electric field component in the traveling direction of the light and the light in the state in which an electric field deviates to one direction is called polarization light. The state in which polarizations in a variety of directions are mixed without a time relationship and no bias is remained is called unpolarization, but when the state without unpolarization, all states of lights are set forth by vector-overlapping of orthogonal two-polarizations. When no phase difference between vibrations of two-polarization components, such state is called a linear polarization, in which the electric field of light is polarized in one specific direction regardless light traveling; and when a phase difference, in accordance with traveling, the polarization becomes an elliptic polarization in which the polarization direction (vibration direction of electric field) rotates and the size thereof varies.

On the other hand, the material which is a natural or an artificial material may have a different refractive index depending on the direction of the crystal axis thereof is called a birefringent material. Such natural material includes quartz and calcite and such artificial crystal includes KTP (potassium titanyl phosphate) and KDP (potassium dihydrogenphosphate) and so forth. Once multiple laser light from the semiconductor lasers 1a-1c are incident to the polarization separation waveplate 3, the incident laser light separates to ordinary ray A and extraordinary ray B every respective laser lights to be incident to the convergence lens 4. The interval between the ordinary ray A and the extraordinary ray B is d2. The d2 varies depending on the difference of refractive indexes of the birefringent material and the light path length passing the birefringent material, so that the interval d2 can be set shorter than the preset interval d1 of the semiconductor lasers 1a-1c. For example, when calcite is used for such material, approximately ⅒ beam of the light path length relative to the polarization separation waveplate 3 shifts.

Ordinarily, the semiconductor lasers light is in many cases strongly polarized in one direction, and unless the incidence angle to the polarization separation waveplate 3 is adjusted, the intensity difference between the ordinary ray A component of the output side and the extraordinary ray B component becomes large, so that the purpose of increasing the degree of the light beam distribution occupation is unachievable. Therefore, it is basic that the polarization direction of the laser incident to the polarization separation waveplate 3 is arranged to be 45 angular degree incidence relative to the optical axis of the polarization separation waveplate 3. According to the aspect of the present Embodiment 1, the mounting direction of the laser per se is determined to provide such polarization angle.

The convergence lens 4 plays a role as a convergence (collecting) lens, by which multiple ordinal rays A and extraordinary rays B laser lights from the polarization separation waveplate 3 are converged, so that the rays (waves) are combined to the optical fiber 5. Specifically, the polarization separation waveplate 3 is installed and the interval d2 is set to be shorter than the preset interval d1 of the semiconductor lasers 1a-1c, so that the space between light beams, which cannot be filled up with only the ordinal ray A, can be filled up with the extraordinary ray B; and consequently, the degree of the light beam distribution occupation increases relative to the lens diameter on the convergence lens 4, so that unevenness of the intensity distribution 7 of fiber output lights can be suppressed.

In addition, despite well common implementation, it is effective that low-reflection coating with single layer or multiple layers of a dielectric material and so forth having extremely low-reflectance relative to the laser wave on the optical surface of each optical element, through which the laser light transmits, is additionally carried out to improve the transmittance of the laser light.

Here, the polarization separation waveplate 3, which is a parallel plate of a birefringent material as the birefringent element, is used, but a Savart plate, in which the polarization separation waveplates are cemented orthogonally relative to the crystal axis, can be used. It is known that the Savart plate does not cause a phase difference between the ordinary ray and the extraordinary ray.

Here, the inventors sets forth e.g., semiconductor lasers as the laser light source, the present invention is feasible for any laser source indicating discrete state, including the laser light source having multiple ordinary laser devices or laser beams as multiple optical fibers are bundled.

In addition, here, a linear-polarized laser is given, but when random light with absolutely unpolarization, an incidence at 45 angular degree is out of consideration, the beam passed through the birefringent element as-is is partitioned to two orthogonal polarization to be able to provide the same effect as the present invention.

Embodiment 2

Figure 2:
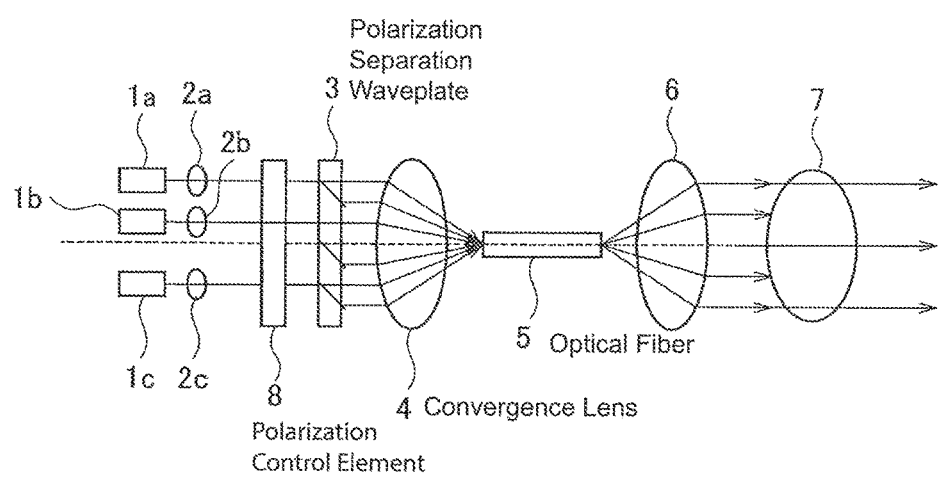
FIG. 2 is a diagram illustrating a structure of the combined-wave laser source according to the aspect of the Embodiment 2 of the present invention.

FIG. 2 is a diagram illustrating a structure of the combined-wave laser source according to the aspect of the Embodiment 2 of the present invention. Referring to FIG. 2, the laser source according to the aspect of the Embodiment 2 comprises a polarization control element 8 between the lenses 2a-2c and a polarization separation waveplate 3 in addition to the structure of the combined-wave laser source according to the aspect of the Embodiment 1 referring to FIG. 1.

The polarization control element 8 functions to rotate the polarization angle of the laser light from the semiconductor lasers 1a-1c and coincidentally adjust the intensities of two orthogonal polarization components.

In general, a semiconductor laser light is polarized to be parallel or perpendicular to the contact surface to the packaging components including the semiconductor chip and the heat-sink and so forth. Accordingly, depending on the package shape, a light incidence to the polarization separation waveplate 3 at the polarization of 45 angular degree may be unworkable structure-wise. In addition, when the laser per se rotates, the beam also coincidentally rotates; and when the beam shape thereof is not a 45 angular degree axis-symmetry, the incident beam shape to the converging lens 4 varies and the characteristic of the laser may undesirably change. According to the aspect of the present Embodiment, the laser light is incident to the polarization separation waveplate 3 while the polarization separation waveplate 3 is controlling the polarization state. While a general semiconductor laser has an anisotropic aspect in which the shape of output beam is elliptical and so forth in many cases, the polarization control element 8 controls polarization of the laser light without changing the angle of the semiconductor lasers 1a-1c, so that the laser light from the semiconductor lasers 1a-1c can be incident to the polarization separation waveplate 3. Specifically, the shape of the laser beam and the polarization direction can be independently controlled. For example, when a λ/2 waveplate is applied to the polarization control element 8, the separation-intensity ratio of the beam becomes controllable and when λ/4 waveplate is applied thereto, the equal separation is feasible due to a circular polarization.

Here, the inventors sets forth e.g., semiconductor lasers, the present invention is feasible for any laser source that indicates a discrete state, including the laser beam emitted from multiple optical fibers.

The combined-wave laser source according to the aspect of the present invention is applicable to particularly a laser processing machine, a laser lighting device, a laser exposure device, a laser exciting fluorescence, a laser measurement, a laser medicine and so forth.

REFERENCE OF SIGNS 1a-1c Semiconductor laser
2a-2c Lens
3 Polarization separation waveplate
4 Convergence lens
5 Optical fiber
6 Collimate lens
7 Light intensity distribution
8 Polarization control element Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A combined-wave laser source, comprising:
    an optical fiber;
    a plurality of laser sources that are in-place in a preset interval with regard to each other and respectively emits laser light;
    a birefringent element that separates spatially an incident laser light to an ordinary ray and an extraordinary ray and outputs separated rays from said respective laser light, the birefringent element comprising at least one of a polarization separation waveplate and a Savart plate, wherein said polarization separation waveplate is at least one of a parallel plate formed with a birefringent material and a Savart plate that is a cemented plate orthogonal to a crystal axis of a birefringent material, an optical axis of the birefringent element being arranged at a 45 degree angle relative to a polarization direction of an incident laser light;
    wherein multiple laser lights from a plurality of laser sources are incident to said birefringent element; and
    a convergence lens that collects the ordinary ray and the extraordinary ray separated by said birefringent element relative to the respective laser lights and converges said rays to the optical fiber.

2. The combined-wave laser source, according to claim 1, wherein:
    a polarization control element that controls polarization of multiple laser lights from said plurality of laser sources, the polarization control element being installed between said plurality of laser sources and said birefringent element.

3. The combined-wave laser source, according to claim 1, further comprising:
    an interval between the ordinary ray and extraordinary ray of said birefringent element that is shorter than a preset interval between said plurality of laser sources.

4. The combined-wave laser source, according to claim 2, further comprising:
    a sealing package that seals said plurality of laser sources.

* * * * *